(12) United States Patent
Orbay et al.

(10) Patent No.: US 12,196,821 B2
(45) Date of Patent: Jan. 14, 2025

(54) CABLE SYSTEM FOR CABLE CONDITION MONITORING

(71) Applicant: Volvo Car Corporation, Gothenburg (SE)

(72) Inventors: Raik Orbay, Gothenburg (SE); Inko Marcaide, Gothenburg (SE)

(73) Assignee: Volvo Car Corporation, Gothenburg (SE)

( * ) Notice: Subject to any disclaimer, the term of this patent is extended or adjusted under 35 U.S.C. 154(b) by 356 days.

(21) Appl. No.: 17/742,823

(22) Filed: May 12, 2022

(65) Prior Publication Data

US 2022/0404435 A1 Dec. 22, 2022

(30) Foreign Application Priority Data

Jun. 18, 2021 (EP) .................................... 21180246

(51) Int. Cl.
*G01R 31/58* (2020.01)
*G01R 31/08* (2020.01)
*H01B 7/18* (2006.01)
*H01B 7/32* (2006.01)

(52) U.S. Cl.
CPC ........... *G01R 31/58* (2020.01); *G01R 31/088* (2013.01); *H01B 7/18* (2013.01); *H01B 7/32* (2013.01)

(58) Field of Classification Search
USPC ........................................................ 324/537
See application file for complete search history.

(56) References Cited

U.S. PATENT DOCUMENTS

2011/0080158 A1* 4/2011 Lawrence ............. H01R 24/42
324/76.12

FOREIGN PATENT DOCUMENTS

| CN | 105075057 A | 11/2015 |
| WO | 20160045692 A1 | 3/2016 |
| WO | 2020055662 A1 | 3/2020 |
| WO | 20200079072 A1 | 4/2020 |

OTHER PUBLICATIONS

Office Action issued by the EPO in priority application EP 21 180 246.7.
Nov. 16, 2021 European Search Report issued in Corresponding EP Application No. 21180246.7.

* cited by examiner

*Primary Examiner* — Farhana A Hoque
(74) *Attorney, Agent, or Firm* — Clements Bernard Walker; Christopher L. Bernard

(57) ABSTRACT

The present disclosure relates to a cable system for cable condition monitoring, a use of such a cable system, a method for manufacturing such a cable system, a method for operating such a cable system and a computer program element for operating such a cable system. The cable system includes a first adapter unit, a first sleeve unit and a cable including at least a first end portion. The first adapter unit is connectable to an energy storage system and the cable is configured for transferring electric power to the first adapter unit. The first sleeve unit is arranged between the first adapter unit and the first end portion of the cable and configured for providing protection therebetween. The first sleeve unit includes a first sensor unit configured for generating data based on strain exerted on the first sleeve unit. The first sensor unit includes a first flexible electronic element extending at least partially to the first end portion of the cable.

14 Claims, 1 Drawing Sheet

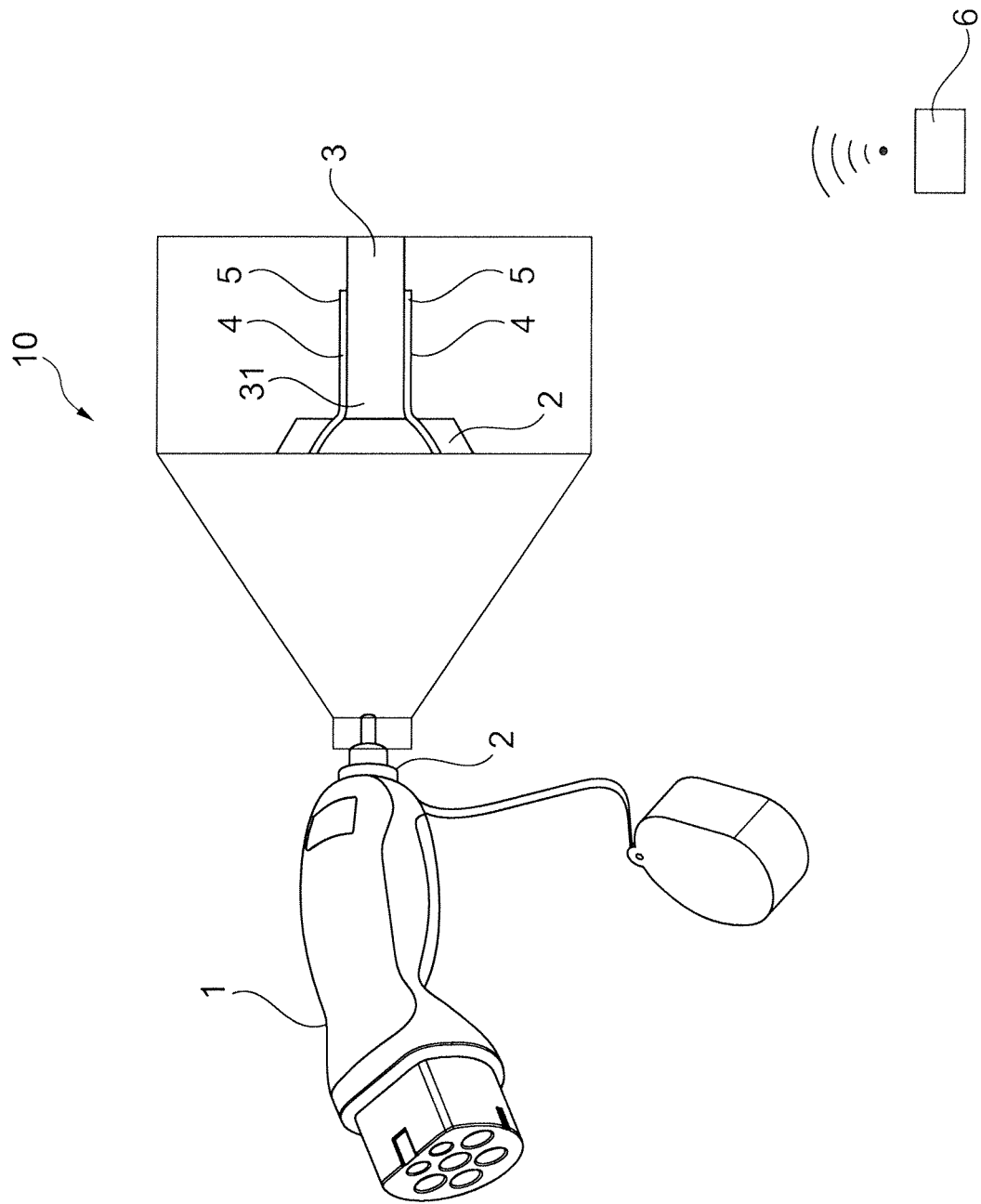

CABLE SYSTEM FOR CABLE CONDITION MONITORING

CROSS-REFERENCE TO RELATED APPLICATION

The present disclosure claims the benefit of priority of co-pending European Patent Application No. 21 180 246.7, filed on Jun. 18, 2021, and entitled "A CABLE SYSTEM FOR CABLE CONDITION MONITORING," the contents of which are incorporated in full by reference herein.

TECHNICAL FIELD

The present disclosure relates to a cable system for cable condition monitoring, a use of such a cable system, a method for manufacturing such a cable system, a method for operating such a cable system and a computer program element for operating such a cable system.

BACKGROUND

High voltage (HV) cables are, among others, used to transfer electric power between an energy storage system and an electrical energy source. During utilization, the HV cables may be affected by various factors such as weather, suspended particles in air and acidic rain, cleaning/waxing/polishing products and their deposits, particles and fumes clinging on vehicle surfaces during usage. Further, the HV cables may sustain damage due to misuse. For instance, a user may force the cable in smaller confinements than allowed and/or the flexible cable may be flexed beyond its elastic limits. In addition, during storage, the HV cables may suffer aging. Cracks may appear on a protective layer of the cable and/or micro cracks may be detected as minute changes in cable elasticity.

SUMMARY

Hence, there may be a need to provide an improved cable system, which monitors cable aging caused by external influences.

The problem is solved by the subject matter of the present disclosure. It should be noted that the aspects of the disclosure described in the following apply to the cable system for cable condition monitoring, the use of such a cable system, the method for manufacturing such a cable system, the method for operating such a cable system and the computer program element for operating such a cable system.

According to the present disclosure, a cable system is presented. The cable system includes a first adapter unit, a first sleeve unit and a cable including at least a first end portion. The first adapter unit is connectable to an energy storage system and the cable is configured for transferring electric power to the first adapter unit. The first sleeve unit is arranged between the first adapter unit and the first end portion of the cable and configured for providing protection therebetween. The first sleeve unit includes a first sensor unit configured for generating data based on strain exerted on the first sleeve unit. The first sensor unit includes a first flexible electronic element extending at least partially to the first end portion of the cable.

The cable system according to the present disclosure may allow monitoring aging of a charging cable precisely. Particularly, the cable may flex at a junction to the adapter unit, which may be an interface between the cable and the energy storage system to be charged and/or an electrical energy source. By positioning flexible electronics at the junction, which may be a critical part of the cable, user's behavior and/or stresses acting on the cable may be reliably detected. In particular, external influences affecting the cable such as mechanical force, UV exposure, chemical exposure, temperature, moisture ingress, accelerations, weight, rodent attack, etc. may be monitored in real time or at least in a predefined time interval. Accordingly, hazards and malfunctions of the cable may be detected at an early stage, hence quality of voltage at common collector (CCV) may be maintained.

The cable may include a conductor element surrounded and protected by an insulation element encased in a sheath. The cable may be connected to the energy storage system to be (re-)charged. In particular, the first end portion of the cable may be fixedly attached to the first adapter unit. The energy storage system may be a battery system, which stores electrical energy and supplies the electric power to a machine and/or device to operate them. Hence, the first adapter unit may be a connecter and it may include a shape of plug or socket for an electrical outlet. The first adapter unit may include, for instance IEC 62196 Type 1 or Type 2 socket. Another end portion of the cable may also include an adapter unit or it may be directly connected to a charging station or an electrical energy source.

At the junction between the first end portion of the cable and the first adapter unit, the first sleeve unit may be arranged. In other words, the first end portion of the cable and the first adapter unit may be joined together at the junction. The junction may be the critical part of the cable, since the user generally grips the first adapter unit with force, which may cause bending, twisting and/or stretching at the junction. The first sleeve unit may be fixedly attached to the first adapter unit and extend at least partially over the first end portion of the cable to provide a protection for such a delicate point. The first sleeve unit may be made of an elastic material such as rubber or plastic.

The first sensor unit including the first flexible electronic element may be integrated in the first sleeve unit and it may monitor conditions of the cable. In particular, the first flexible electronic element may detect strain exerted on the first sleeve unit via the first adapter unit and/or the first end portion of the cable based on its elasticity. In other words, the first flexible electronic element may measure stress applied on the first sleeve unit in real time by means of change of a form of the first flexible electronic element or the first sensor unit stretching or shrinking. The first sensor unit may include a first processing element generating data based on measurements of the first flexible electronic element to determine whether the strain exerted on the first sleeve unit may be critical or not for further use of the cable.

In an example, the first flexible electronic element is configured to be stretchable based on tensile strain exerted on the first sleeve unit. The first flexible electronic element may measure pressure distribution on the first sleeve unit and send signals to the first processing element of the first sensor unit. The processing element may convert the signals to strength exerted on the first sleeve unit. Among the various external influences, the tensile strain or compressive strain, which may be exerted by human induced bending, twisting and/or stretching, may be predictable based on the user's behavior to avoid further stress on the cable. Hence, the user may prevent a damage of the cable or the first sleeve unit by adjusting tensile strain exerted on the first sleeve unit and/or the cable. However, the application may be not limited to a human use but the first flexible electronic element may also measure tensile strain or compressive strain exerted by an automatized system such as a robot arm.

The first flexible electronic element is not only flexible but also stretchable. The term "stretchable" may be understood that the first flexible electronic element may be expanded when the tensile force is applied but recovered to its original size and form when the tensile force is removed. For this purpose, conductive sensing components of the first flexible electronic element may be printed on a very thin but flexible and conformable substrate (layer), which enables the first flexible electronic element stretchable. Since the first flexible electronic element may extend from the first sleeve unit to the first end portion of the cable, it may measure precisely the tensile strain exerted on the critical part of the cable, i.e. junction between the cable and the first sleeve unit.

In an example, the first sensor unit is further configured for generating data based on integrity of the cable. In other words, the first flexible electronic element may be configured for generating data based on an elasticity of the cable. The insulation element of the cable may be made of rubber, silicon or any polymer material suitable for entirely insulating the conductor element from environment. The material of the insulation element may be the same as the material of the first sleeve unit. Alternatively, the material of the insulation element may differ from the material of the first sleeve unit and/or the cable sheath.

The insulation element, however, may be affected by external stresses such as tensile strain, weather, humidity, temperature, accelerations, weight, UV exposure, chemical exposure, moisture ingress, rodent attack, etc., which may cause material degradation and/or micro cracks/fissures on the insulation element of the cable. Such material aging may influence the elasticity of the insulation element. The first sensor unit may produce elasticity data at the junction between the first sleeve unit and the end portion of the cable based on the measurements of the first flexible electronic element to reliably monitor the state of the cable. Accordingly, a precise aging/damage measurement of the cable may be achieved.

In an example, the first sensor unit may be configured for generating data based on conductivity or resistance of the cable. Generally, the first sensor unit may be galvanically insulated from the cable. However, an induction based measurement of electrical magnitudes may allow determining a quality of the conductor element of the cable.

In an example, the first sensor unit is further configured for generating data based on temperature of the cable. The temperature of the first sleeve unit or the cable may also affect their aging. Temperature measurements at the first sleeve unit or the cable by the first sensor unit, preferably by the first flexible electronic element, may be logged as a cumulative temperature, which may impair the elasticity of the insulation element of the cable. The first sensor unit may produce temperature data at the junction between the first sleeve unit and the end portion of the cable to reliably monitor the state of the cable. Accordingly, the precise aging measurement of the cable may be achieved.

In an example, the first sensor unit may be further configured for generating data based on humidity or UV exposure of the cable. The first flexible electronic element may be configured to measure humidity on the first sleeve unit and/or the first end portion of the cable. Additionally, the first flexible electronic element may measure further external influences, which may affect the aging of the cable such as weight, acceleration, balance etc. Consequently, the first sensor unit may produce respective measurement data based on the measurements of the first flexible electronic element at the junction between the first sleeve unit and the first end portion of the cable.

In an example, the first sensor unit may be configured to combine generated data and predict user's preferences and/or behavior. Accordingly, a dynamic measurement system can be achieved, which improves monitoring the cable. Internet of things (IoT) based methodology may further tailor an acquisition of data needed according to the customer preferences/usage patterns.

In an example, the cable system further includes a second adapter unit and a second sleeve unit. The second sleeve unit is arranged between the second adapter unit and a second end portion of the cable. The second sleeve unit includes a second sensor unit configured for generating data based on strain exerted on the second sleeve unit. In other words, the cable system may be formed symmetrically such that the same arrangement of the first adapter unit, the first sleeve unit and the first sensor unit is provided at the second end portion of the cable. The cable system may be a transportable cable system.

The second end portion of the cable may be fixedly attached to the second adapter unit and the second sleeve may be configured for providing protection between the second adapter unit and the second end portion of the cable. Further, the second sensor unit may include a second flexible electronic element extending at least partially to the second end portion of the cable. The second flexible electronic element may be also configured to be stretchable based on tensile strain exerted on the second sleeve unit. The second sensor unit may be further configured for generating data based on the external influences such as weather, weight, acceleration, balance, UV exposure, chemical exposure, moisture ingress, rodent attack, etc. Accordingly, the second sensor unit may produce respective measurement data at the junction between the second sleeve unit and the second end portion of the cable to perform the precise aging measurement of the cable system.

If required, an amount of sensor may be increased as a length of the cable or with respect to a current or future application of the cable to be conceived.

In an example, the second adapter unit is configured to be coupled with a charging station and/or an energy source. The transportable cable system may be configured to be connectable to a public or private charging station or to an electrical grid for charging the energy storage system.

In an example the sensor unit may include the capability to allow for data acquisition for two way usage, i.e. allowing a vehicle to a grid operation.

In an example, the cable system further includes a control unit. The control unit is configured for receiving data generated by the first sensor unit and/or the second sensor unit and estimating an aging state of the cable based on the received data. The control unit may include a capacity for real time computations and provide a data repository. The first sensor unit and/or the second sensor unit may be configured to send generated measurement data to the control unit. Based on the measurement data, the control unit may analyze behavior or preferences of the user rigorously, which may allow calculating an aging degree of the cable to prevent use of a damaged cable. Both of analysis and calculated aging state may be stored in the control unit to estimate the state of the cable based on cumulative data.

In an example, the control unit is further configured to generate a warning signal based on the aging state of the cable if the cable being required to be changed. The warning signal may be in form of light, message and/or beep. The control unit may send information on the aging state of the cable to a user interface device such that the user may monitor the current state of the cable. Additionally, the control unit may warn the user about a critical state of the cable via the user interface device such that the user may repair or change the cable. The user interface device may be, for instance, a computer, a mobile devices, a display on the charging station and/or a display in a vehicle to be charged.

In an example, the control unit is configured to receive data from the first sensor unit and/or the second sensor unit via wireless communication. The control unit may be integrated either in the first or the second sleeve unit or separately arranged outside the cable system. For instance, the control unit may be arranged in the user interface device, the charging station and/or the vehicle to be charged. The first sensor unit, the second sensor unit (and more units if needed) and the control unit may include a wireless communication module to send and receive data mutually via wireless internet access, Wi-Fi, Bluetooth or the like. Accordingly a continuous on-line monitoring of the cable can be realized.

In an example, the first adapter unit and/or the second adapter unit may be formed as a handle. In case of the cable system configured for charging the energy storage system, each adapter unit, which may be connected to a vehicle and/or a charging station in a freely dismountable fashion, may be formed user-friendly and ergonomically. Accordingly, the first adapter unit and/or the second adapter unit may be shaped as a handle for facilitating grasp to avoid excessive force applied on the cable.

In an example, the cable system is configured for transferring high voltage power. The cable system, particularly the cable, the first adapter unit and the second adapter unit may be configured to transfer electric power of several kV up to several hundred kV. The cable may be a high voltage (HV) cable. Different types of HV cables may be used for a variety of purpose in instruments, ignition systems, and alternating current (AC) and direct current (DC) power transmission.

In an embodiment, the first sensor unit and/or second sensor unit may include a system-on-chip design for estimating the aging state of the cable based on locally realizable computations/estimations.

According to the present disclosure, a use of a cable system as described above is presented. The cable system may be used for (re-)charging an energy storage system of an electric vehicle. In other words, the energy storage system may be part of an electric vehicle. The vehicle may be a plug-in vehicle, which can be recharged from an external power source of electricity. The vehicle may a battery electric vehicle or a plug-in hybrid vehicle. In addition to road vehicles, the vehicle may be also any other electric vehicles powered by the energy storage system for propulsion of their traction motors such as rail vehicles, electric watercraft and/or electric aircraft. However, the cable system may be not limited to charging the energy storage system, but it may be also used as an extension cable connecting at least one other cable.

The cable system may also support two way energy transfer, vehicle to grid as well as grid to vehicle, vehicle to vehicle, etc.

According to the present disclosure, a method for manufacturing a cable system for cable condition monitoring is presented. The method includes:
providing a first adapter unit,
providing a first sleeve unit including a first sensor unit,
providing a cable including at least a first end portion, and
arranging a first sleeve unit between the first adapter unit and the first end portion of the cable.

The first adapter unit is connectable with the energy storage system. The cable is configured for transferring electric power to the first adapter unit. The first sleeve unit is configured for providing protection between the first adapter unit and the cable. The first sensor unit is configured for generating data based on strain exerted on the first sleeve unit. The first sensor unit includes a first flexible electronic element extending at least partially to the first end portion of the cable.

According to the present disclosure, a method for operating a cable system is presented. The method includes:
connecting a first adapter unit with an energy storage system of an electric vehicle,
connecting a second adapter unit with a charging station and/or an energy source,
transferring electric power from the second adapter unit to the first adapter unit via a cable,
generating data based on strain exerted on the first sleeve unit and the second sleeve unit,
sending generated data to a control unit via a wireless communication, and
estimating an aging state of the cable based on the received data.

Alternatively, the first adapter unit and/or the second adapter unit may be also connected to another vehicle or electrical grid/infrastructure.

In an embodiment, the operating method may further include estimating the aging state of the cable based on locally realizable computations/estimations via system-on-chip design.

In an embodiment, the operating method may apply an IoT based methodology to tailor an acquisition of data required with respect to the customer preferences/usage patterns.

In an embodiment, the operating method may further include providing an amendment for antenna, providing an amendment for cybersecurity, providing capacity for real time computations and data repository and/or providing redundancy for failure modes and calibration. Accordingly, a precise aging measurement of the cable may be achieved.

A tailored antenna may be printed on flexible electronic element during production. Foreseeable future may allow for a miniaturization of GSM system-on-chip to be incorporated into the flexible electronic element including a digital SIM. A tailored firewall on the stretchable electronics may assure only connection to preprogrammed IP, end-to-end encoding.

A tailored processing capacity may effectively perform monitoring functions on the flexible electronic element based sensor unit. Whenever there is a problem with cloud services, the system may likewise continue to monitor all the needed magnitudes and assure secure operation.

According to the present disclosure, a computer program element is presented. The computer program element is adapted to parse the operating method as described above, which when being executed by an energy efficient processing element and/or solar power.

It should be noted that the above embodiments may be combined with each other irrespective of the aspect involved. Accordingly, the method may be combined with structural features and, likewise, the system may be combined with features described above with regard to the method.

These and other aspects of the present embodiments will become apparent from and elucidated with reference to the embodiments described hereinafter.

BRIEF DESCRIPTION OF THE DRAWINGS

Exemplary embodiments will be described in the following with reference to the following drawing.

FIG. 1 shows schematically and exemplarily an embodiment of a cable system according to the present disclosure.

DESCRIPTION OF EMBODIMENTS

FIG. 1 shows a cable system 10 for monitoring cable condition such as aging. The cable system may be used for charging an energy storage system of an electric vehicle. The electric vehicle may be a plug-in vehicle, which can be recharged from an external power source of electricity. The electric vehicle may include amendment for vehicle-to-vehicle, vehicle-to-grid, and vehicle-to-infrastructure operation.

The cable system 10 includes a first adapter unit 1, a first sleeve unit 2 and a cable 3 including at least a first end portion 31. The first adapter unit 1 is connectable to the energy storage system and the cable 3 is configured for transferring electric power to the first adapter unit 1. The first sleeve unit 2 is arranged between the first adapter unit 1 and the first end portion 31 of the cable 3 and configured for providing protection therebetween. The first sleeve unit 2 includes a first sensor unit 4 configured for generating data based on strain exerted on the first sleeve unit 2. The first sensor unit 4 includes a first flexible electronic element 5 extending at least partially to the first end portion 31 of the cable 3.

The first flexible electronic element 5 is configured to detect external influences affecting the cable 3 and/or the first sleeve unit 2. Particularly, the first flexible electronic element 5 is stretchable based on tensile strain or compressive strain exerted on the first sleeve unit 2. Further, the first flexible electronic element 5 may also detect temperature, elasticity, humidity, weight, UV exposure, chemical exposure, moisture ingress, rodent attack, etc. The first sensor unit 4 generates data based on detected information by the first flexible electronic element 5 and send it to a control unit 6.

The cable system 10 may be formed symmetrically such that it includes a second adapter unit and a second sleeve unit. The second sleeve unit may be arranged between the second adapter unit and a second end portion of the cable 3. The second sleeve unit may include a second sensor unit configured for generating data based on strain exerted on the second sleeve unit. The second adapter unit may be connected to a charging station and/or an energy source to provide electric power to the energy storage system.

The control unit 6 is configured for receiving data generated by the first sensor unit 4 and/or the second sensor unit and estimating an aging state of the cable 3 based on the received data. The control unit 6 is further configured to generate a warning signal based on the aging state of the cable 3 if the cable 3 is required to be changed, refurbished or repaired. The control unit 6 receives the generated data by the first sensor unit 4 and the second sensor unit and send the warning signal by means of a wireless communication such as wireless internet access, Wi-Fi, Bluetooth or the like.

The first adapter unit 1 and/or the second adapter unit being formed as a handle to facilitate a use of the cable system 10.

It has to be noted that embodiments of the disclosure are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the disclosure has been illustrated and described in detail in the drawings and description, such illustration and description are to be considered illustrative or exemplary and not restrictive. The disclosure is not limited to the disclosed embodiments. Other variations to the disclosed embodiments can be understood and effected by those skilled in the art in practicing a claimed disclosure, from a study of the drawings, the disclosure, and the dependent claims.

In the claims, the word "comprising" does not exclude other elements or steps, and the indefinite article "a" or "an" does not exclude a plurality. A single processor or other unit may fulfil the functions of several items re-cited in the claims. The mere fact that certain measures are re-cited in mutually different dependent claims does not indicate that a combination of these measures cannot be used to advantage. Any reference signs in the claims should not be construed as limiting the scope.

The invention claimed is:

1. A cable system for cable condition monitoring, the cable system comprising:
   a first adapter unit;
   a first sleeve unit; and
   a cable comprising at least a first end portion;
   wherein the first adapter unit is connectable to an energy storage system;
   wherein the cable is configured for transferring electric power to the first adapter unit;
   wherein the first sleeve unit is arranged between the first adapter unit and the first end portion of the cable and configured for providing protection therebetween;
   wherein the first sleeve unit comprises a first sensor unit configured for generating data based on strain exerted on the first sleeve unit; and
   wherein the first sensor unit comprises a first flexible electronic element extending at least partially to the first end portion of the cable.

2. The cable system according to claim 1, wherein the first flexible electronic element is configured to be stretchable based on tensile strain exerted on the first sleeve unit.

3. The cable system according to claim 1, wherein the first sensor unit is further configured for generating data based on integrity of the cable.

4. The cable system according to claim 1, wherein the first sensor unit is further configured for generating data based on temperature of the cable.

5. The cable system according to claim 1, wherein the first sensor unit is further configured for generating data based on humidity or UV exposure of the cable.

6. The cable system according to claim 1, further comprising a second adapter unit and a second sleeve unit, wherein the second sleeve unit is arranged between the second adapter unit and a second end portion of the cable, and wherein the second sleeve unit comprises a second sensor unit configured for generating data based on strain exerted on the second sleeve unit.

7. The cable system according to claim 6, wherein the second adapter unit is configured to be coupled with a charging station and/or an energy source.

8. The cable system according to claim 6, further comprising a control unit, wherein the control unit is configured for receiving data generated by the first sensor unit and/or the second sensor unit and estimating an aging state of the cable based on the received data.

9. The cable system according to claim 8, wherein the control unit is further configured to generate a warning signal based on the aging state of the cable if the cable is required to be changed.

10. The cable system according to claim 8, wherein the control unit is configured to receive data from the first sensor unit and/or the second sensor unit via wireless communication.

11. The cable system according to claim 1, wherein the cable system is configured for transferring high voltage power.

12. A method for manufacturing a cable system for cable condition monitoring, the method comprising:
    providing a first adapter unit;
    providing a first sleeve unit comprising a first sensor unit;
    providing a cable comprising at least a first end portion; and
    arranging the first sleeve unit between the first adapter unit and the first end portion of the cable;
    wherein the first adapter unit is connectable to an energy storage system;
    wherein the cable is configured for transferring electric power to the first adapter unit;
    wherein the first sleeve unit is configured for providing protection between the first adapter unit and the cable;
    wherein the first sensor unit is configured for generating data based on strain exerted on the first sleeve unit; and
    wherein the first sensor unit comprises a first flexible electronic element extending at least partially to the first end portion of the cable.

13. A method for operating a cable system comprising a first adapter unit, a first sleeve unit, a cable comprising at least a first end portion, wherein the first adapter unit is connectable to an energy storage system, wherein the cable is configured for transferring electric power to the first adapter unit, wherein the first sleeve unit is arranged between the first adapter unit and the first end portion of the cable and configured for providing protection therebetween, wherein the first sleeve unit comprises a first sensor unit configured for generating data based on strain exerted on the first sleeve unit, and wherein the first sensor unit comprises a first flexible electronic element extending at least partially to the first end portion of the cable, and a second adapter unit and a second sleeve unit, wherein the second sleeve unit is arranged between the second adapter unit and a second end portion of the cable, and wherein the second sleeve unit comprises a second sensor unit configured for generating data based on strain exerted on the second sleeve unit, the method comprising:
    connecting the first adapter unit to the energy storage system of an electric vehicle;
    connecting the second adapter unit to a charging station and/or an energy source;
    transferring electric power from the second adapter unit to the first adapter unit via the cable;
    generating data based on strain exerted on the first sleeve unit and the second sleeve unit;
    sending generated data to a control unit via a wireless communication; and
    estimating an aging state of the cable based on the generated data.

14. A computer program element for the cable system, which, when executed by a processing element, is adapted to perform the method steps of claim 13.

* * * * *